(12) United States Patent (10) Patent No.: US 6,861,313 B2
Song (45) Date of Patent: Mar. 1, 2005

(54) SEMICONDUCTOR MEMORY DEVICE AND FABRICATION METHOD THEREOF USING DAMASCENE BITLINE PROCESS

(75) Inventor: Du-Heon Song, Gyeonggi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/607,597

(22) Filed: Jun. 27, 2003

(65) Prior Publication Data

US 2004/0007727 A1 Jan. 15, 2004

(30) Foreign Application Priority Data

Jul. 12, 2002 (KR) .................................. 10-2002-0040806

(51) Int. Cl.[7] .......................................... H01L 21/8242
(52) U.S. Cl. ...................... 438/253; 438/256; 438/396; 438/399
(58) Field of Search ................................ 438/253, 256, 438/396, 399; 257/306

(56) References Cited

U.S. PATENT DOCUMENTS 6,436,758 B1 * 8/2002 Jang ............................ 438/241
2002/0173094 A1 * 11/2002 Park et al. ................... 438/241
2003/0232471 A1 * 12/2003 Yokoyama ................... 438/253

* cited by examiner

Primary Examiner—Amir Zarabian
Assistant Examiner—Christy Novacek
(74) Attorney, Agent, or Firm—Marger, Johnson & McCollom, P.C.

(57) ABSTRACT

A semiconductor memory device includes a silicon substrate with a gate and contact pads at both sides of the gate, an inter-insulation layer formed on the substrate, including a storage node contact and a bit-line contact exposing a corresponding contact pad, and including a groove-shaped bit-line pattern, a storage node contact plug formed in the storage node contact, and a damascene bit line formed within the bit-line pattern and connected with the exposed corresponding contact pad through the bit-line contact.

11 Claims, 19 Drawing Sheets

SEMICONDUCTOR MEMORY DEVICE AND FABRICATION METHOD THEREOF USING DAMASCENE BITLINE PROCESS

CROSS REFERENCE TO RELATED APPLICATIONS

This application claims priority from Korean Patent Application No. 2002-40806, filed on Jul. 12, 2002, the contents of which are hereby incorporated by reference in their entirety.

BACKGROUND OF THE INVENTION

1. Field of the Invention

This disclosure relates to a semiconductor memory device, and more particularly, to a semiconductor memory device and a fabrication method that includes forming a bit-line with a damascene process after a storage node contact formation. This prevents bridge failures caused by voids and reduces a leakage current.

2. Description of the Related Art

Generally, as the size of a semiconductor memory device decreases, the cell pitch is correspondingly reduced. The reduction in pitch causes problems such as voids due to gap-fill failures in an inter-insulation layer, bridge failures between the storage node contacts due to the voids, and leakage current between the bit-line and the storage node contact due to scaling down the size of the bit-line spacer.

FIGS. 1A, 2A, 3A, and 4A are cross-sectional views and FIGS. 1B, 2B, 3B, and FIG. 4B are corresponding plan views illustrating a fabrication method of a conventional semiconductor memory device. FIGS. 1A and 2A are cross-sectional views taken along the line IA—IA of FIG. 4B, and FIGS. 3A and 4A are cross-sectional views illustrating the relation between a bit-line and a storage node contact of the prior semiconductor memory device having a plan structure of FIG. 4B.

Referring to FIGS. 1A and 1B, a silicon substrate 100 includes a field region 101 and an active region 105, and a conventional shallow trench isolation STI process is performed to form a field isolation region 110 in the field region 101 of the silicon substrate 100. Gates 120 crossing the active region 105 are formed on the silicon substrate 100. In other words, on the silicon substrate 100, a gate insulation layer 121, a polysilicon layer 123, a tungsten (W) layer 125, and a cap nitride layer 127 are deposited sequentially and patterned using a gate mask (not shown) to form the gates 120. Furthermore, a gate spacer 130, such as a nitride layer, is formed on the sidewall of each gate 120.

Referring to FIGS. 2A and 2B, a first inter-insulation layer 140 on the silicon substrate 100 and a conventional self-aligned contact process is performed to form self-aligned contacts (SACs) 150. A conductive layer for a SAC contact pad, for example a polysilicon layer, is deposited, and a chemical mechanical polishing (CMP) process or an etch-back process is performed to form SAC contact pads 160 in the SACs 150, respectively. Sequentially, a second inter-insulation layer 170 is deposited on the silicon substrate 100 and patterned to form a bit-line contact 175 to expose the corresponding contact pad of the SAC contact pads 160 which is to be connected with a bit-line in the following process.

Referring to FIGS. 3A and 3B, a conductive layer for a bit line and a capping insulation layer, such as a nitride layer, are deposited on the silicon substrate 100. The conduction layer and the capping insulation layer are patterned to form a bit-line 180 that includes a capping layer 185. The bit-line 180 is connected with the corresponding SAC contact pad 160 through the bit-line contact 175.

Referring to FIGS. 4A and 4B, a third inter-insulation layer 190 is deposited on the substrate 100 and the third inter-insulation layer 190 and the second inter-insulation layer 170 are patterned to form a storage node contact 195. The storage node contact 195 exposes the corresponding contact pad of the SAC contacts pads. Even though not shown in the drawings, a conventional capacitor fabrication process is performed to form a capacitor connected with the corresponding SAC contact pad 160 through the storage node contact 195, thereby fabricating a conventional dynamic random access memory (DRAM) device.

However, the conventional DRAM device fabrication method has the problems of reduction in a thickness of the bit-line spacer due to reduction in a cell pitch, and a leakage current between the bit-line 180 and the storage node contact 195 due to the thickness reduction of the bit-line spacer. In more, the conventional DRAM device fabrication method also has the problems of a void due to a gap-fill fail in the third inter-insulation layer 190, a bridge fail between the storage node contacts 195 due to the void, and a reduction of the overlay margin of the storage node contact 195.

Embodiments of the invention address these and other problems in the prior art.

BRIEF DESCRIPTION OF THE DRAWINGS

For a more complete understanding of the invention and the advantages thereof, reference is now made to the following descriptions taken in conjunction with the accompanying drawings, in which like reference numerals denote like parts.

FIGS. 1A to 4A are cross-sectional diagrams illustrating a fabrication method of a conventional semiconductor memory device.

FIGS. 1B to 4B are plan diagrams illustrating a fabrication method of the conventional semiconductor memory device;

FIGS. 5A to 13A are cross-sectional diagrams illustrating a fabrication method of a semiconductor memory device according to an embodiment of the present invention;

FIGS. 5B to 13B are plan diagrams illustrating a fabrication method of a semiconductor memory device according to an embodiment of the present invention;

FIGS. 10C to 13C are cross-sectional diagrams illustrating a fabrication method of a semiconductor memory device according to an embodiment of the present invention;

DETAILED DESCRIPTION OF THE INVENTION

Reference will now be made in detail to exemplary embodiments of the invention, examples of which are illustrated in the accompanying drawings.

Figure 12A:
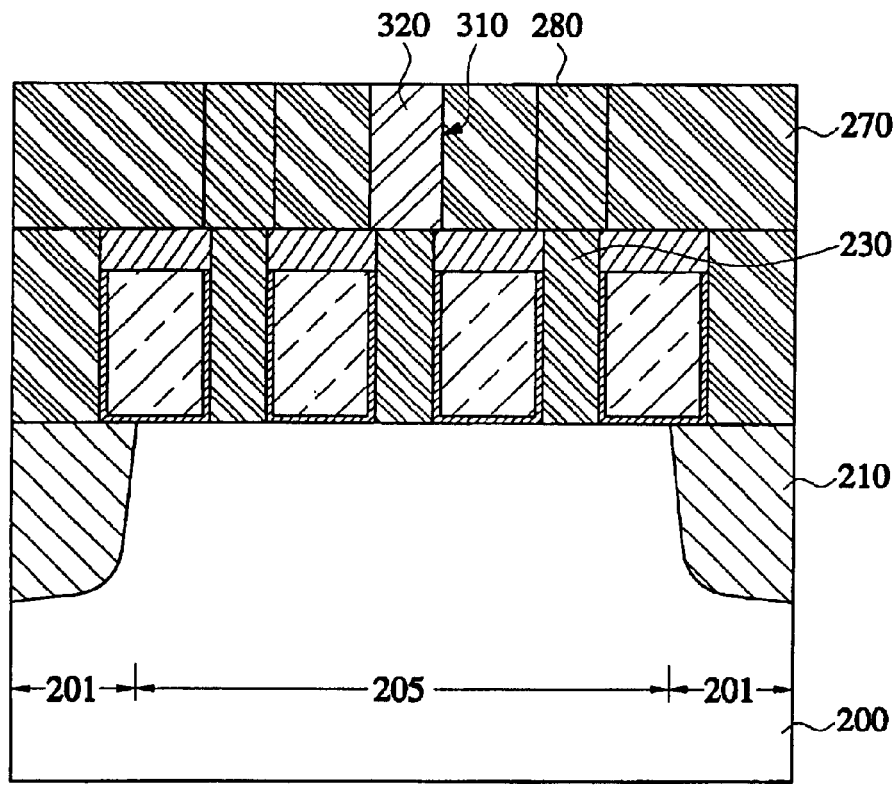
Figure 12B:
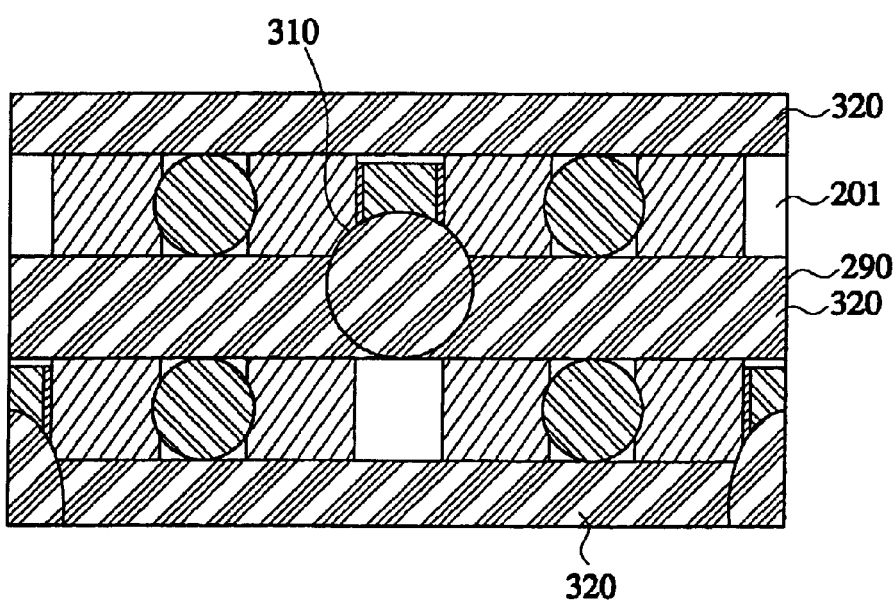
Figure 12C:
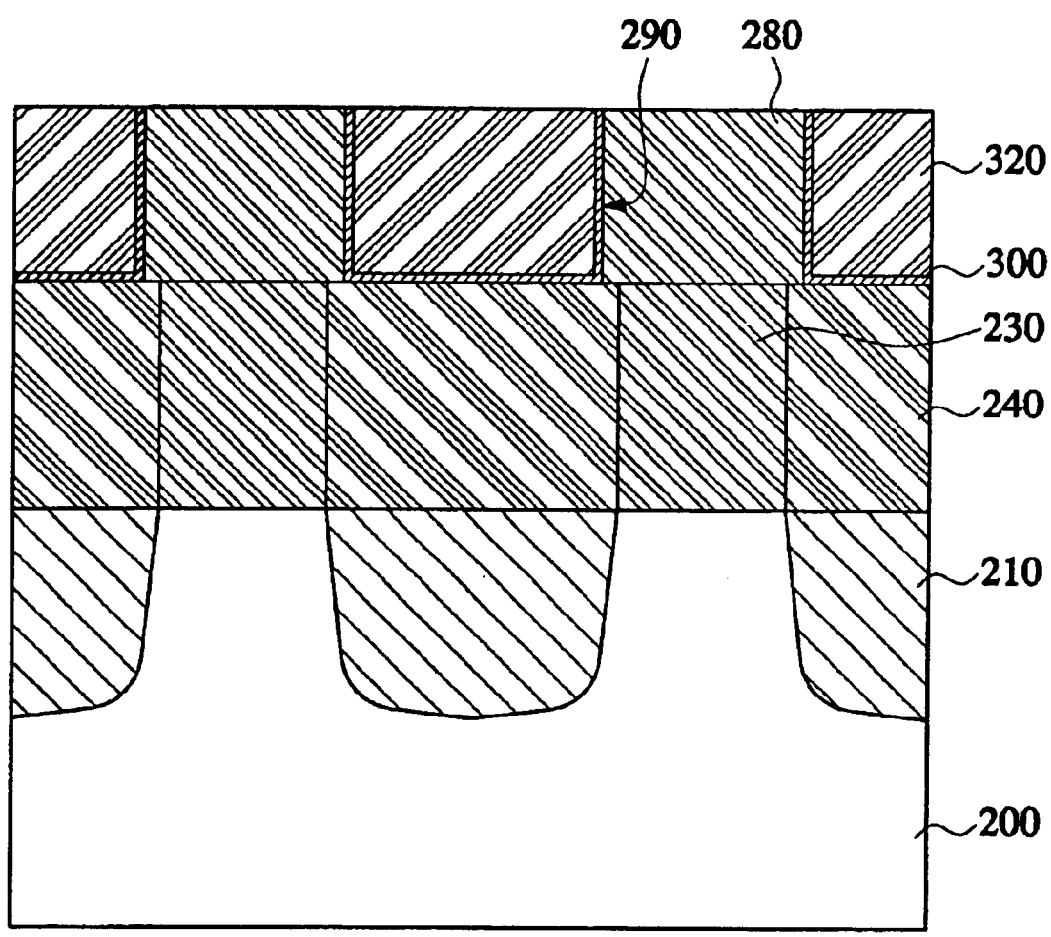
Figure 13A:
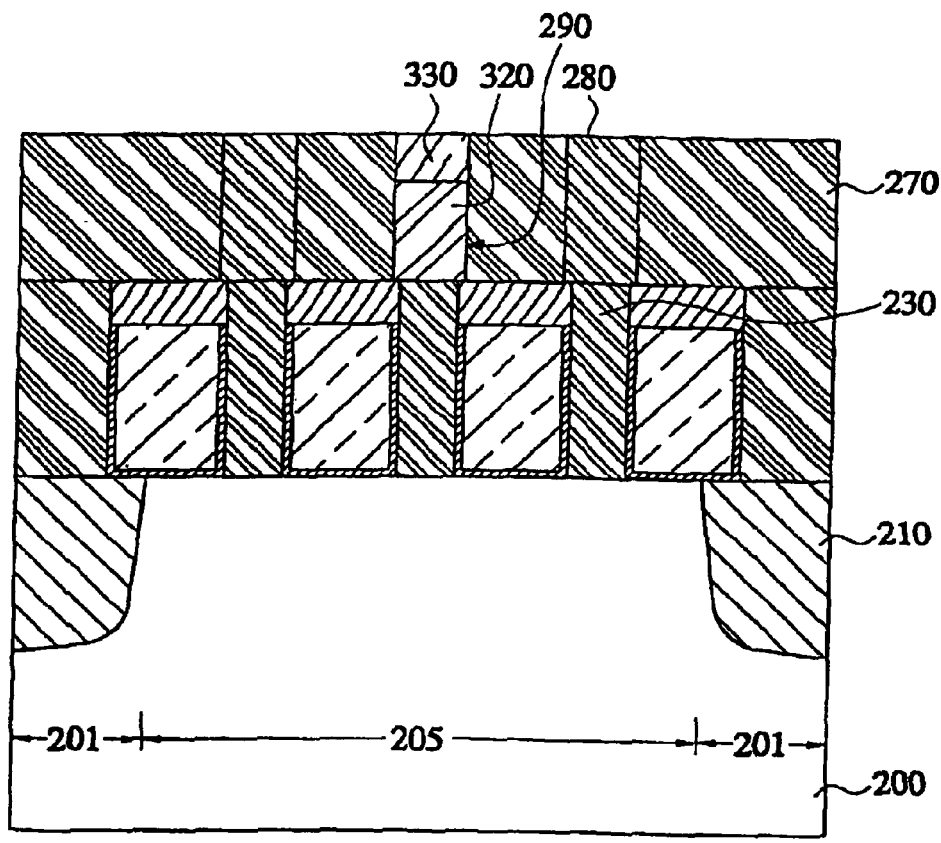
Figure 13B:
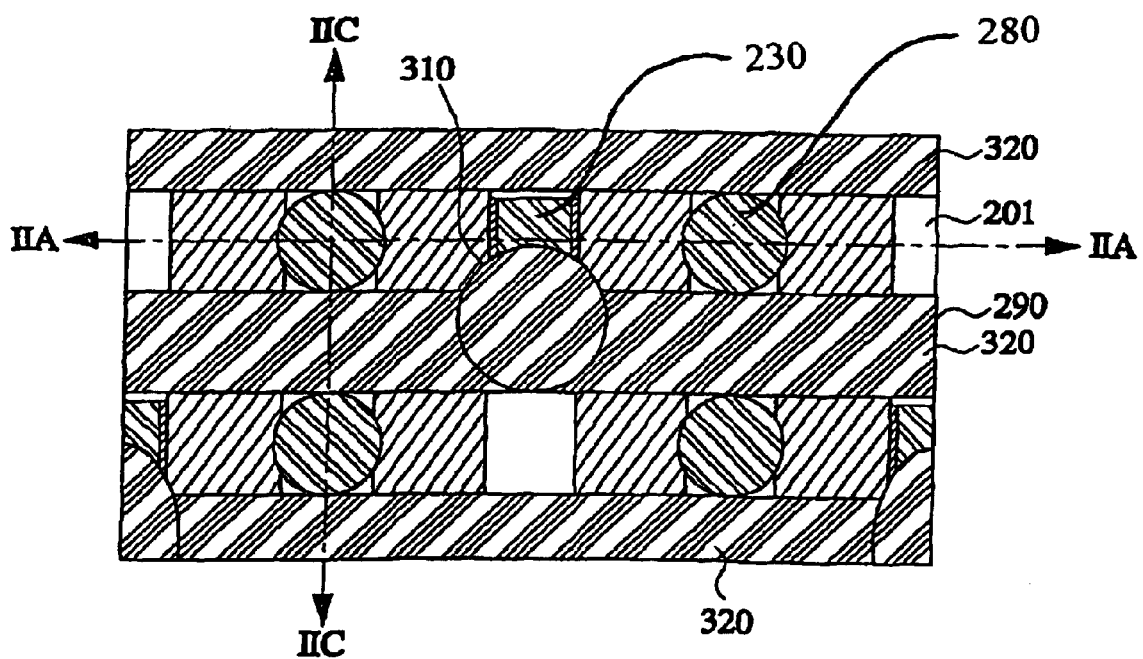

FIGS. 5A to 13A and FIGS. 10C to 13C are cross-sectional views taken along the line IIA—IIA and the line IIC—IIC, respectively, of FIG. 13B, illustrating a fabrication method of a semiconductor memory device according to an embodiment of the invention. FIGS. 5B to 13B are plan views illustrating a fabrication method of the semiconductor memory device of an embodiment of the invention.

Figure 1A:
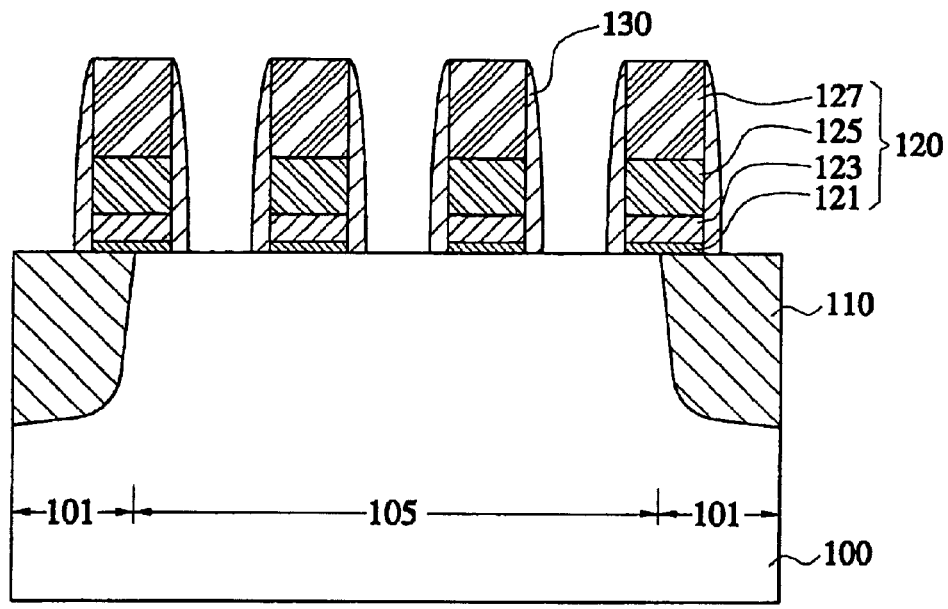
Figure 1B:
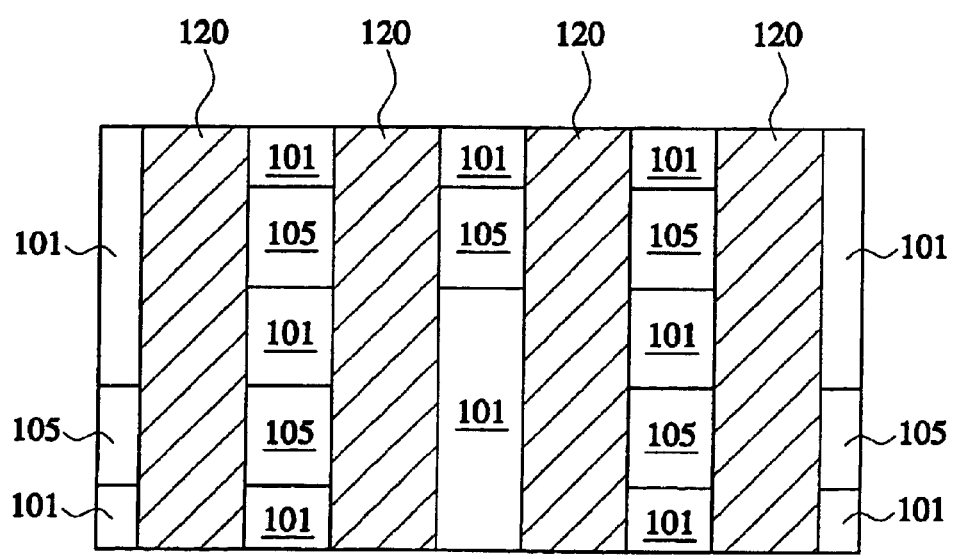
Figure 2A:
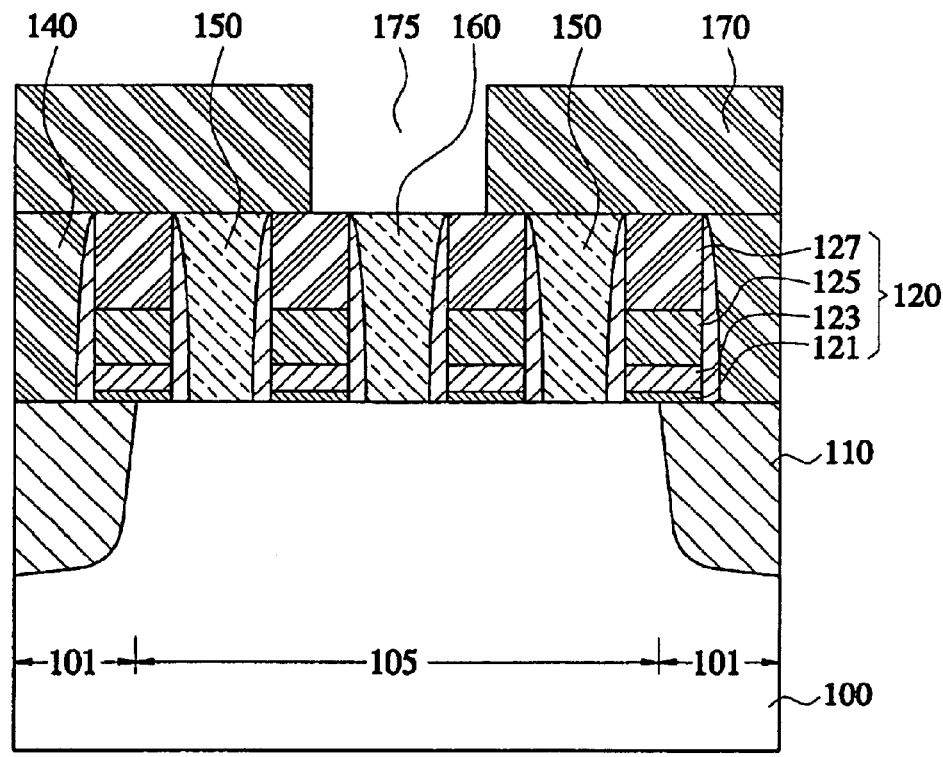
Figure 2B:
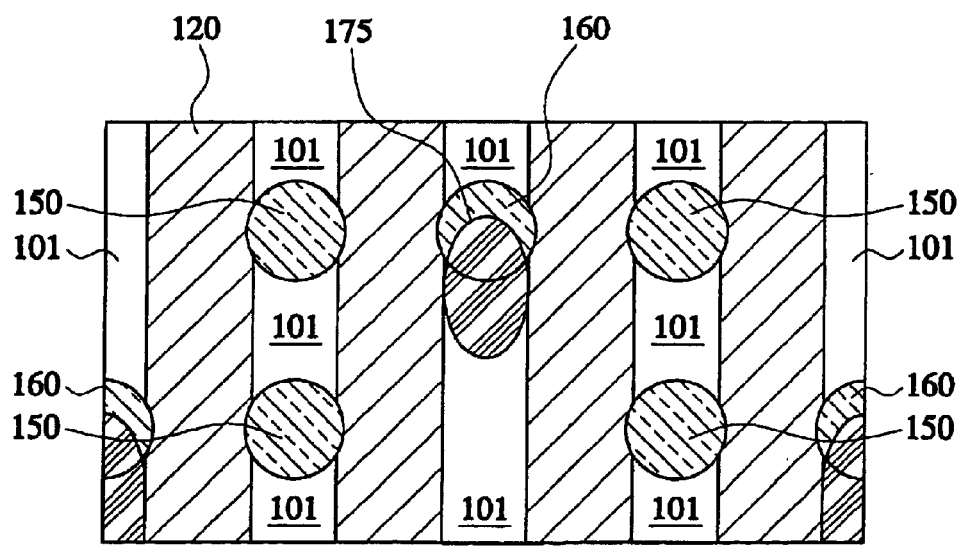
Figure 3A:
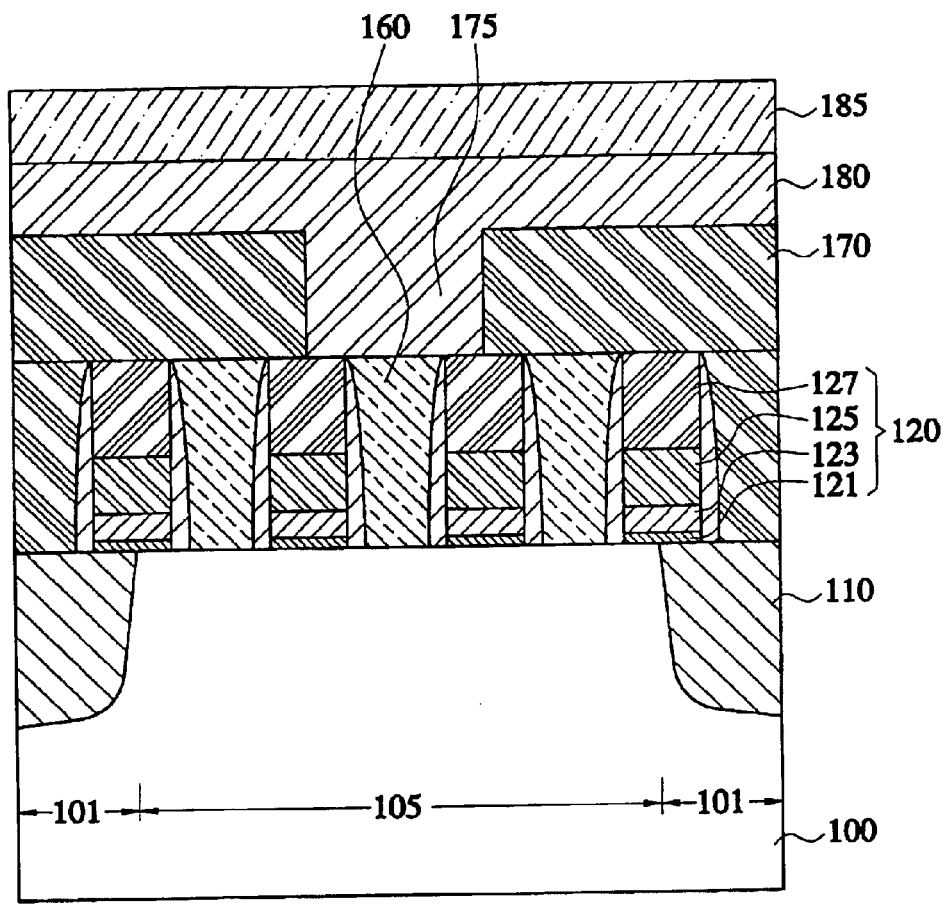
Figure 3B:
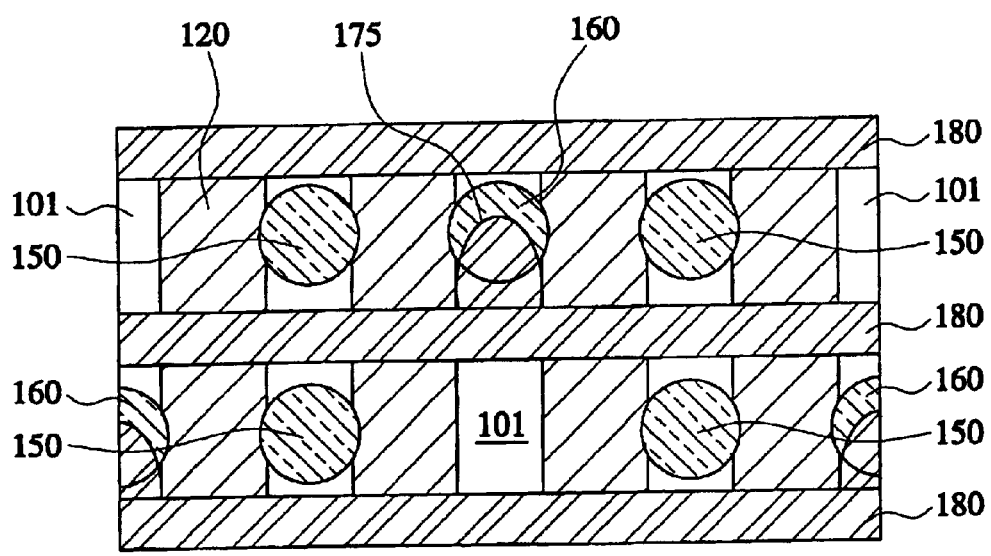
Figure 4A:
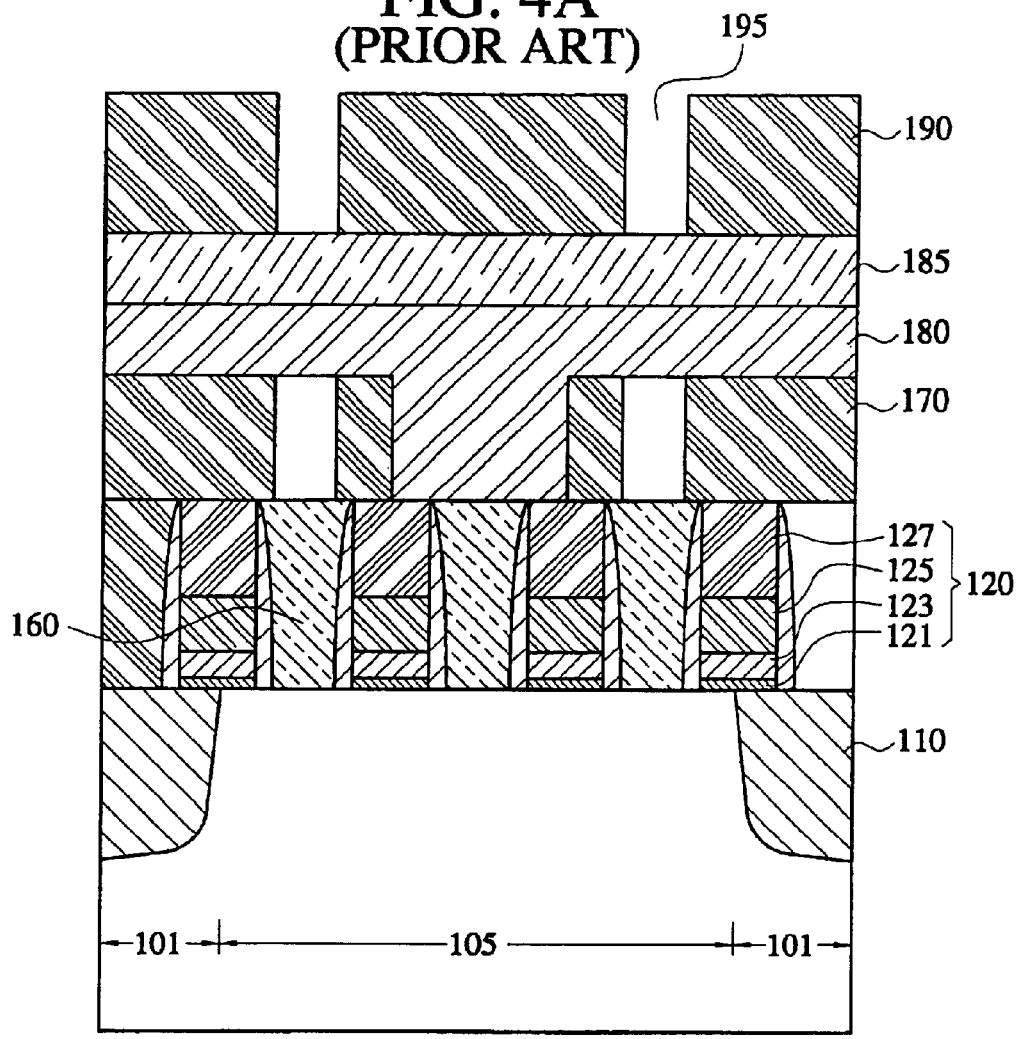
Figure 4B:
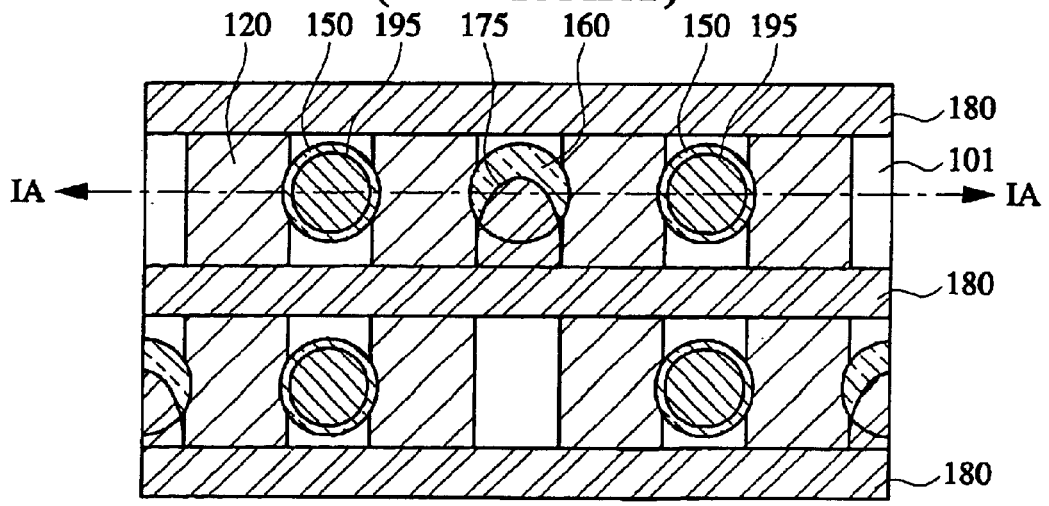
Figure 5A:
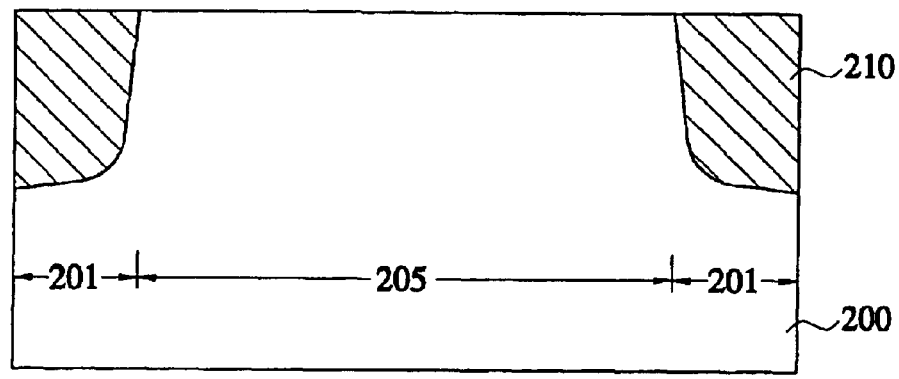
Figure 5B:
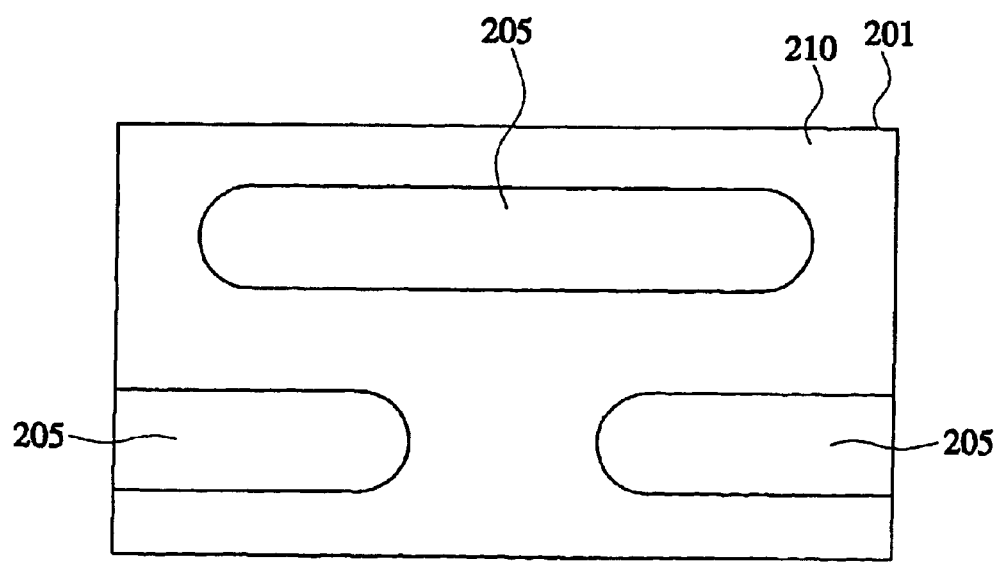

Referring to FIGS. 5A and 5B, a silicon substrate 200 includes a field region 201 and an active region 205. A conventional shallow trench isolation STI process is performed to form an STI field isolation 210. The field isolation 210 isolates the active region 205 from the adjacent active region 205.

Figure 6A:
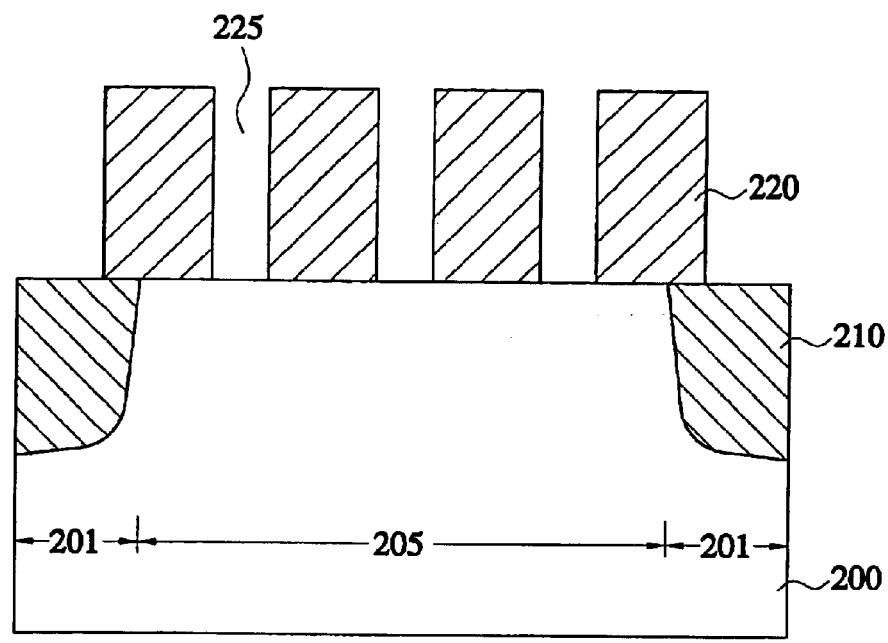
Figure 6B:
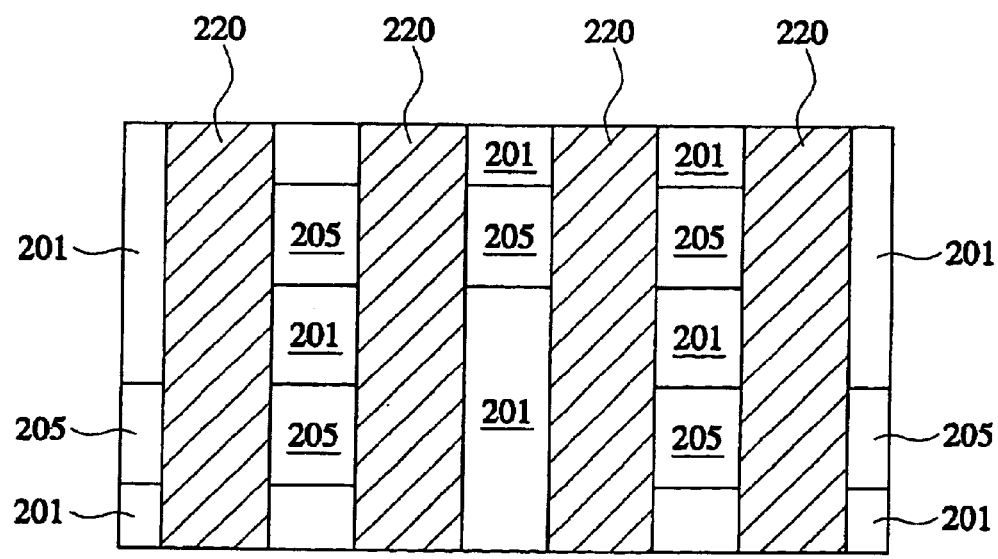

Referring to FIGS. 6A and 6B, an oxide layer is formed on the substrate 200 through a sacrifice oxidation process and a nitride layer is deposited on the oxide layer. Using a gate mask (not shown), the nitride layer and the oxide layer are patterned to form sacrifice gates 220 including a sacrifice gate insulation layer (not shown). The sacrifice gates 220 cross the active region 205, and they have the same shape as gates formed in a subsequent process. With the sacrifice gate formation, openings 225 are formed to expose portions of the active region 205 where contact pads will be located.

Figure 7A:
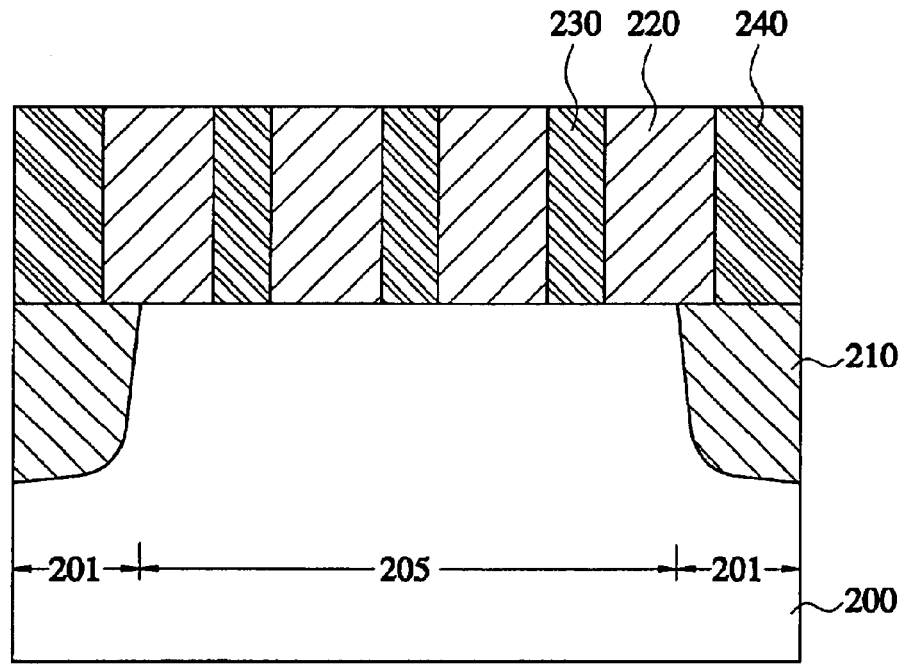
Figure 7B:
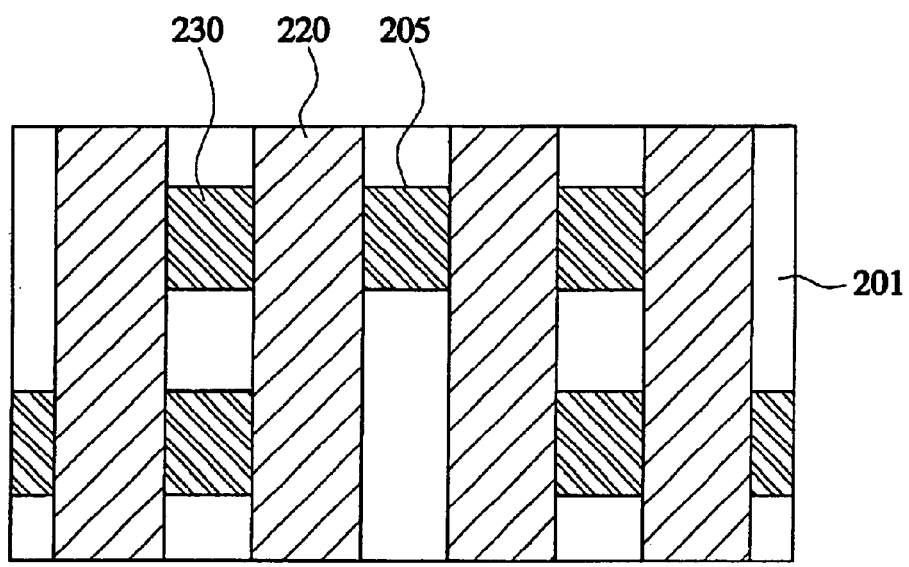

Referring to FIGS. 7A and 7B, on the exposed portions of the active regions 205 a silicon layer is grown through an anisotropic selective epitaxial process to form contact pads 230 within the openings 225. Instead of a selective epitaxial growth, a polysilicon layer is deposited on the substrate 200 and then etched through a CMP process or an etch-back process to form the contact pads 230. Then, a first inter-insulation layer 240 is deposited on the silicon substrate 200 and the CMP process is performed to planarize the silicon substrate 200.

The first inter-insulation layer 240 is formed after contact pad formation to prevent a bridge fail between the pads 230 due to a void of the first inter-insulation layer. Furthermore, an open fail due to a reduction of the contact open area is prevented and a contact resistance is decreased due to a reduction of the contact area between the active region and the contact pad and surface treatment.

Figure 8A:
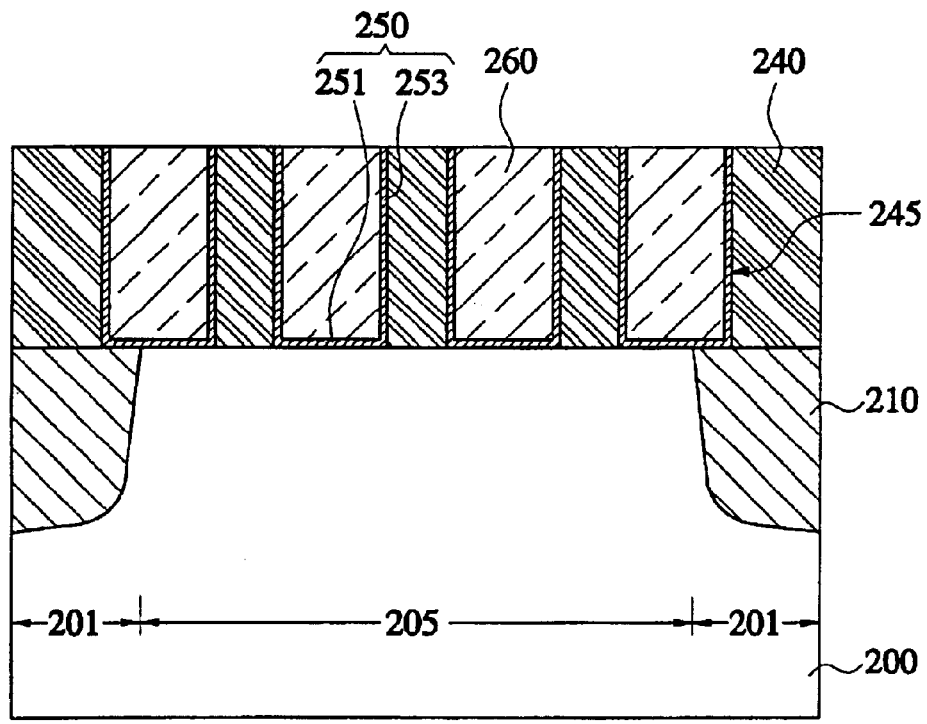
Figure 8B:
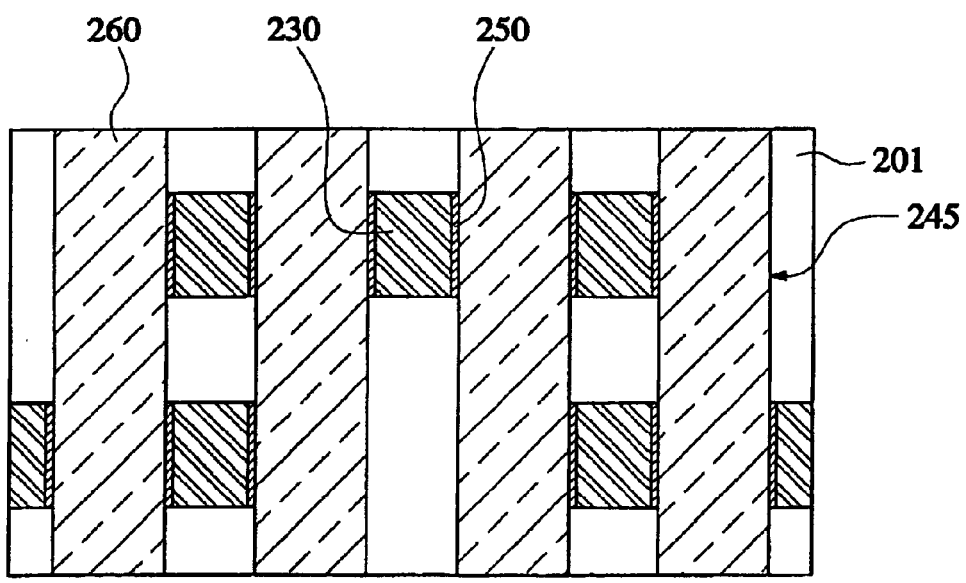

Referring to FIGS. 8A and 8B, by removing the sacrifice gates 220 including a sacrifice gate insulation layer, openings 245 are formed. An oxide layer 250 is grown on the substrate 200 through a thermal oxidation process and a gate electrode material is deposited on the oxide layer 250. The gate electrode material and the oxide layer are etched through a CMP process to form damascene gates 260 within the openings 245 which are formed by removing the sacrifice gates 220. A portion of the oxide layer 250 formed on the bottom of the gate 260 is a gate insulation layer 251, and a portion of the oxide layer 250 formed on the sidewall of the gate 260 is a gate space 253r. The gate 260 can have various structures such as a stack of a polysilicon layer and a metal layer of tungsten, a single metal layer of tungsten, or a stack of a polysilicon layer and a silicide layer. Instead of the thermal oxide layer 250, an oxide layer or a high dielectric layer, such as aluminum oxide $Al_2O_3$, hafnium oxide $HfO_2$, Zirconium oxide $ZrO_2$, or tantalum oxide $Ta_2O_5$ may alternatively be deposited through a deposition process.

In the embodiment, the gate insulation layer and the gate spacer including the oxide layer 250 are formed simultaneously through a thermal oxidation process or a deposition process. Therefore, because the gate spacer is a thermal oxide layer or a high dielectric layer with excellent dielectric characteristics, a leakage current between the gate and the contact pad 230 can be prevented. At this time, the oxide layer 250 has a thickness of 10 to 200 Å. Of the oxide layer 250, the gate insulation layer 251 and the gate spacer 253 have almost the same thickness, in other words, they are within a thickness difference of 7 nm. The thickness difference is caused by the oxidation rate due to the difference of the doping concentration between the contact pad 230 and the silicon substrate 200 exposed by the opening 245 in the thermal oxidation process. In other words, the thickness difference is caused by the step coverage between the contact pad 230 and the silicon substrate 200 in a deposition process.

Figure 9A:
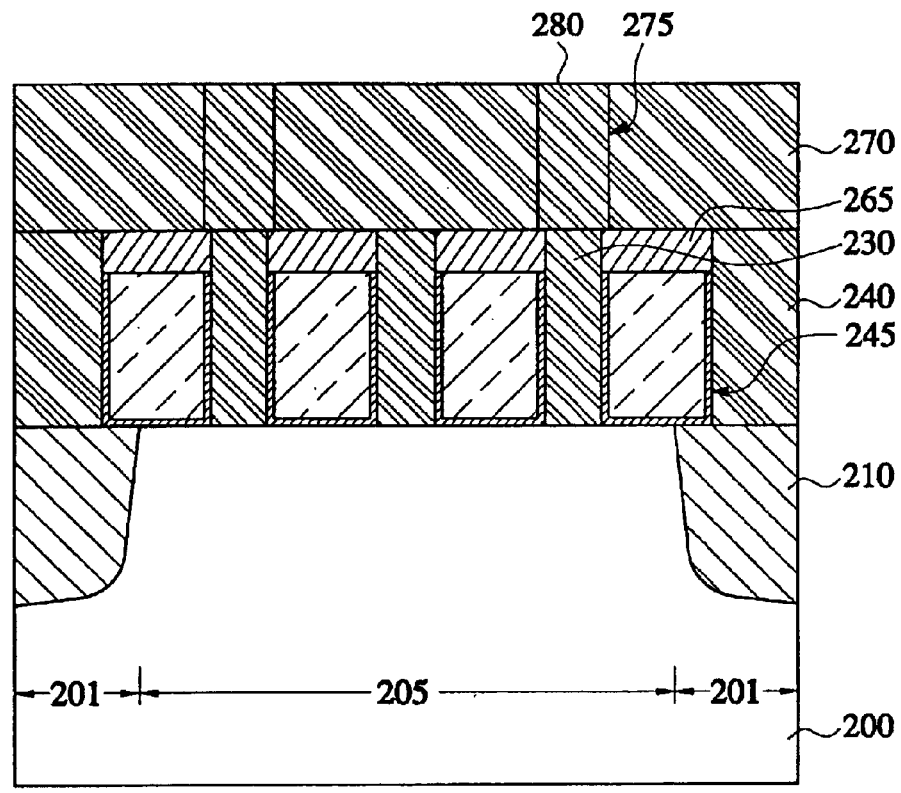
Figure 9B:
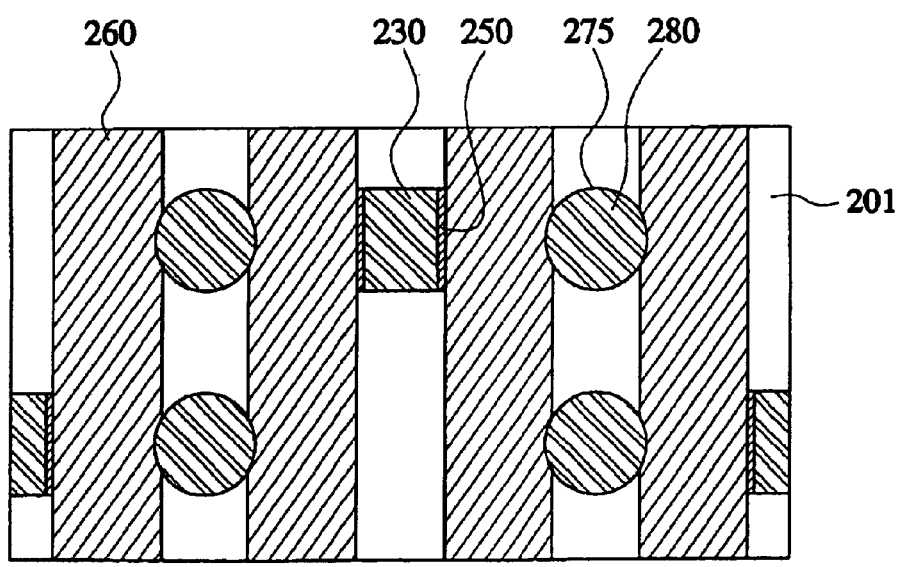

Referring to FIGS. 9A and 9B, a portion of the gate 260 is etched-back and an insulation layer, such as an oxide layer or a nitride layer, is deposited. Sequentially, a CMP process is performed to form a capping layer 265 on the top of the gate 260 within the opening 245. A second inter-insulation layer 270 is deposited on the silicon substrate 200 and patterned to form a storage node contact 275 exposing the corresponding contact pad of the contact pads which is to be connected with a capacitor in a subsequent process. Sequentially, a storage node contact plug 280 is formed by selectively growing a silicon layer in the storage node contact 275 through an anisotropic epitaxial growth as the SAC contact pad 230. Otherwise, the storage node contact plug 280 may be formed by depositing a polysilicon layer on the substrate and then etching it through a CMP process or an etch back process.

In this embodiment of the invention, only the portion of the second inter-insulation layer 270 where the storage node contact 275 is to be formed is etched and then the contact plug 280 is formed. Therefore, the storage node contact is formed with a size larger than that of the prior art, and the overlay margin of the storage node contact is sufficiently ensured.

The cross-sectional length in the bottom of the storage node contact plug 280 is longer than that of the contact pad 230. That is, the cross-sectional length of the storage node contact plug 280 in the bit-line direction of the line IIA—IIA of FIG. 13B and the cross sectional length in the gate direction of the line IIC—IIC of FIG. 13B are longer than those of the contact pad 230.

Figure 10A:
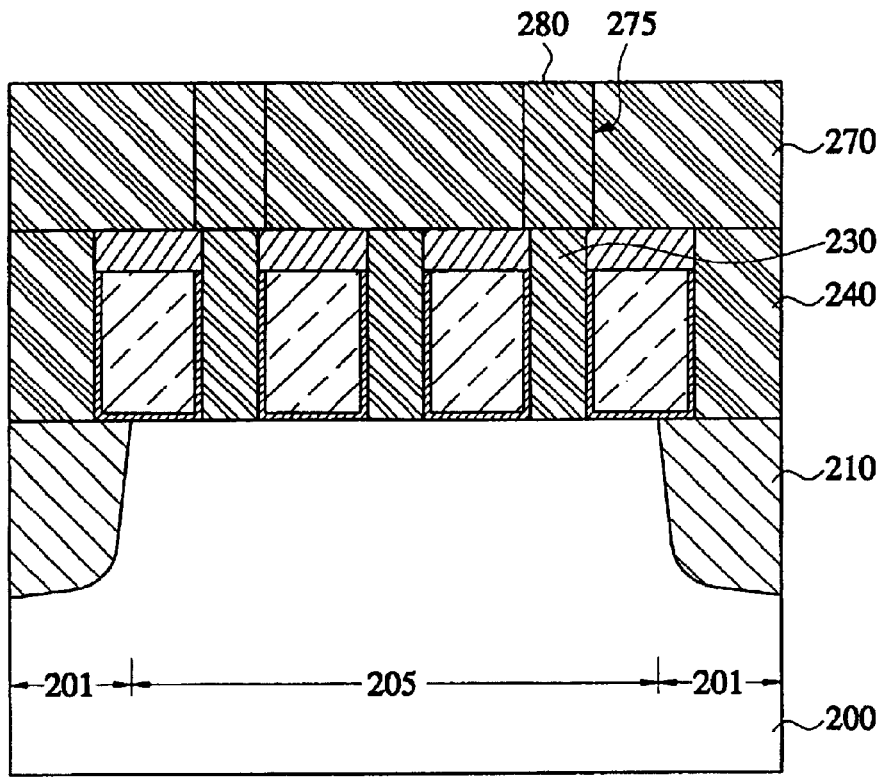
Figure 10B:
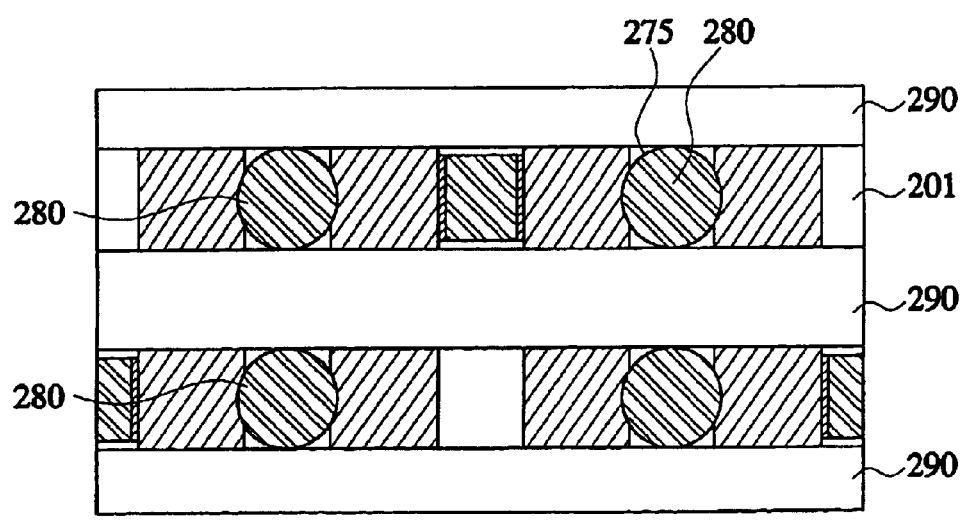
Figure 10C:
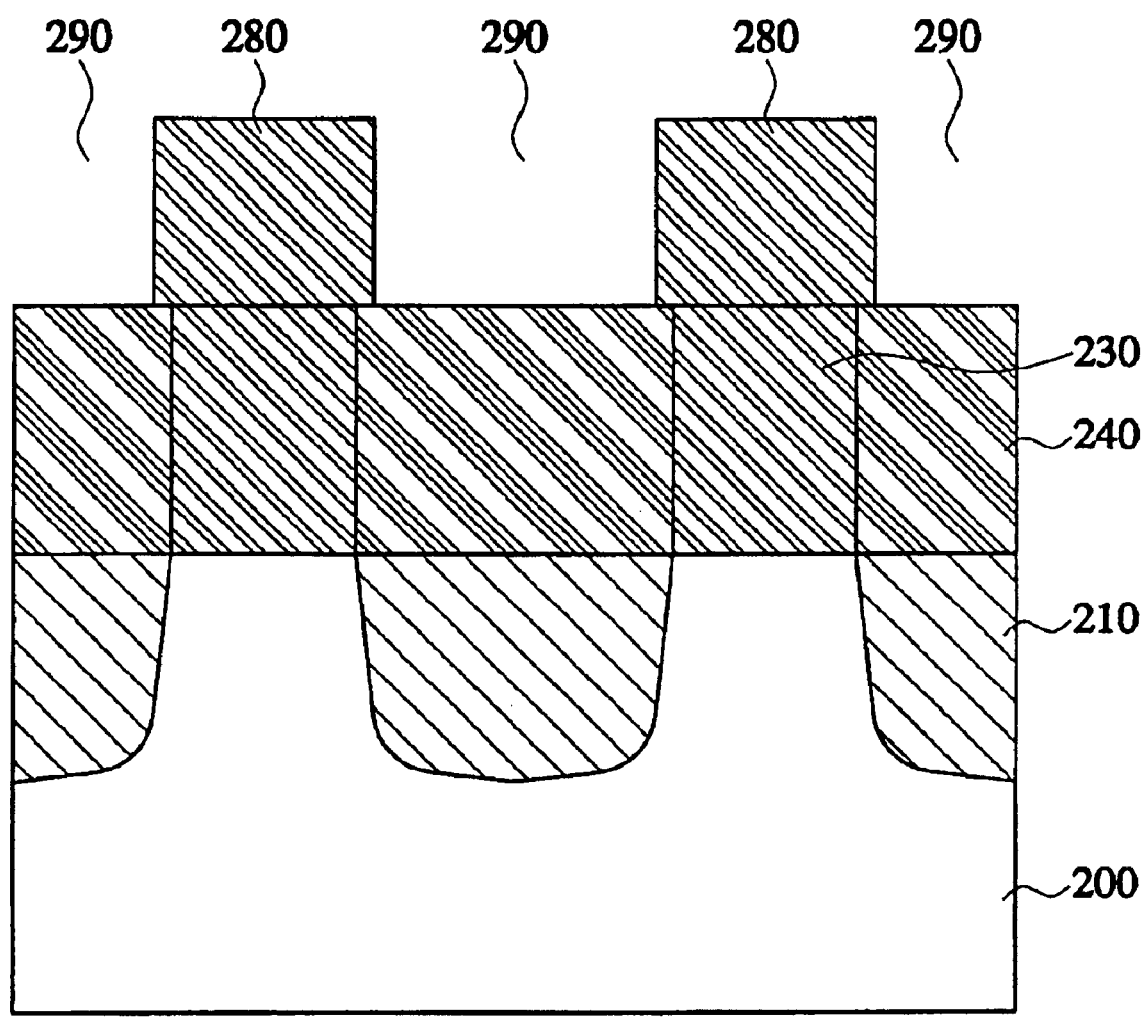

Referring to FIGS. 10A to 10C, a portion of the second inter-insulation layer 270 where a bit-line is to be formed in a subsequent process is etched to form a bit-line pattern 290 that has a grooved shape. In other words, the second inter-insulation layer 270 is etched through a SAC process to form a bit-line pattern 290 that has a grooved shape and crosses the gate 260.

Figure 11A:
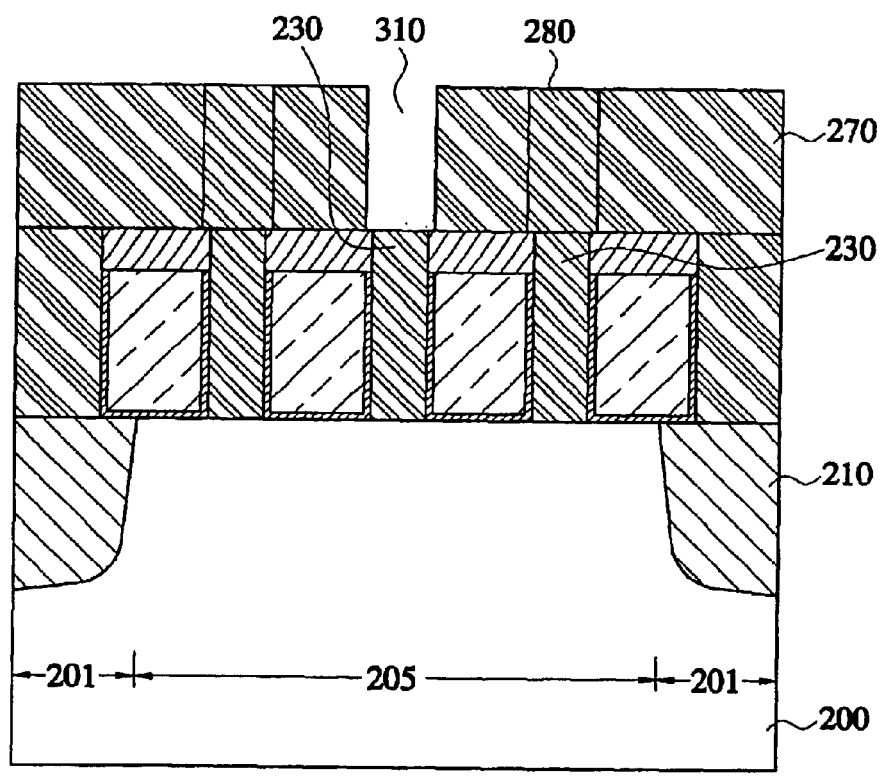
Figure 11B:
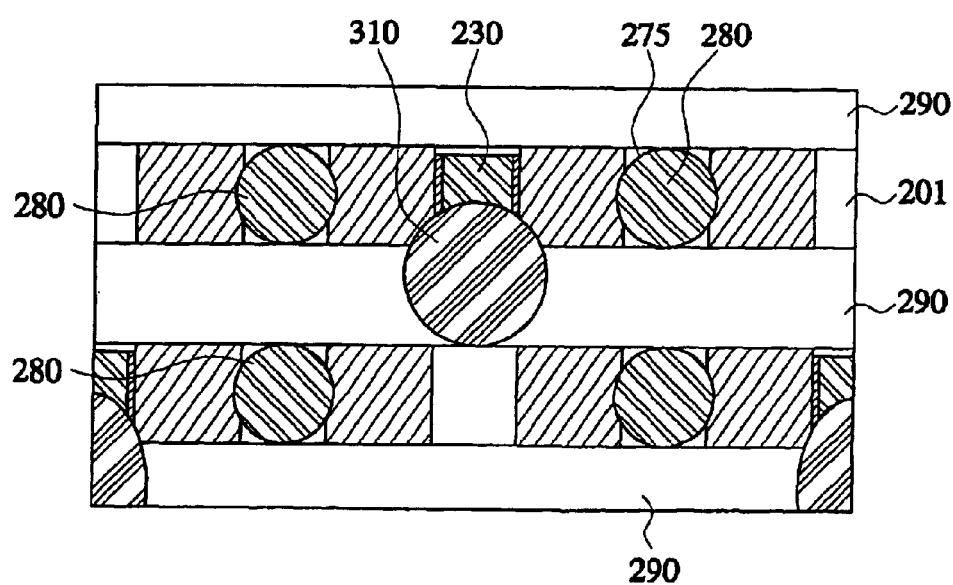
Figure 11C:
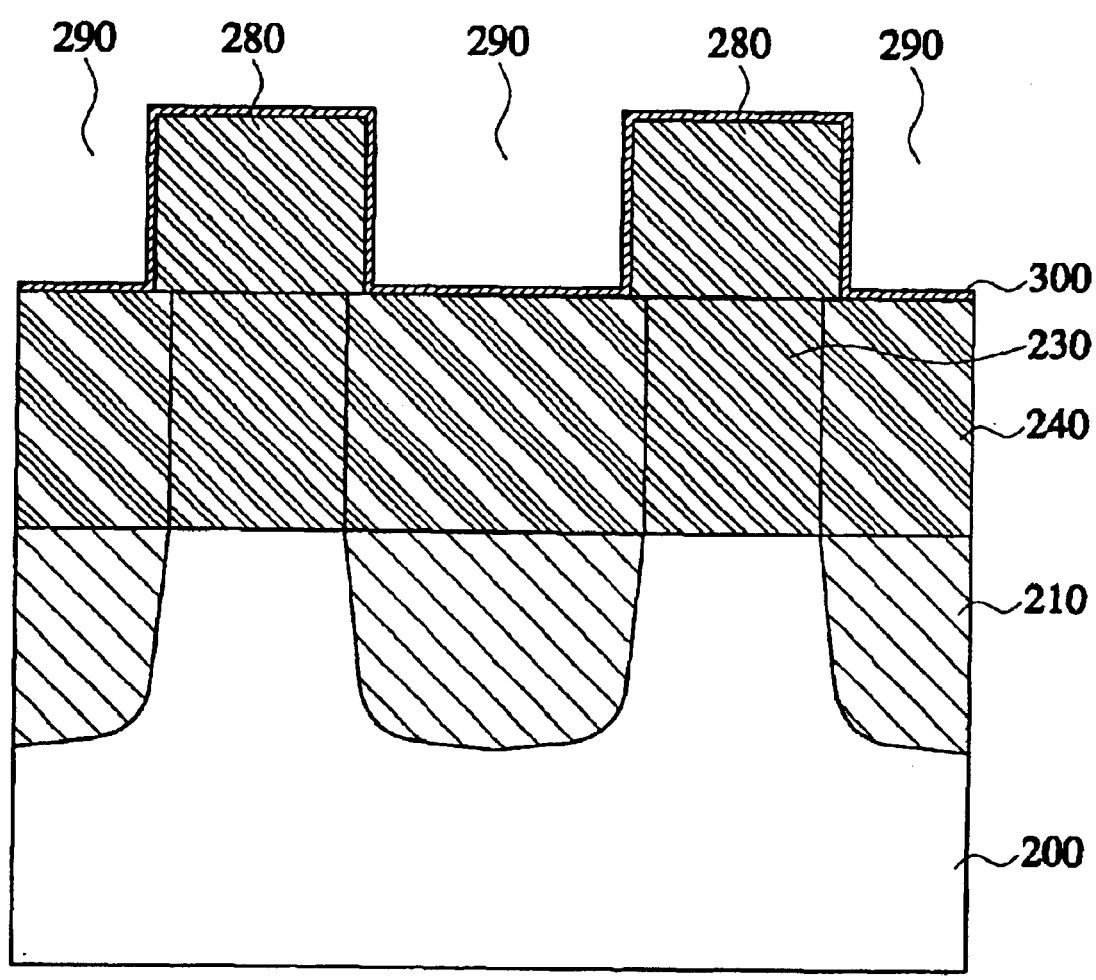

Referring to FIGS. 11A to 11C, an insulation layer 300 for a bit-line spacer is formed on the substrate 200. An oxide layer is formed by a thermal oxidation process or a deposition process or a high dielectric layer is deposited by a deposition process to form the insulation layer 300. Sequentially, the second inter-insulation layer 270 is etched through a SAC process to form a bit-line contact 310. The bit line contact 310 exposes the corresponding contact pad of the contact pads 230 that are connected to a bit line in a subsequent process.

Referring to FIGS. 12A to 12C, a conductive material for a bit-line is deposited on the silicon substrate and etched through a CMP process to form the bit-line 320 within the groove-shaped bit-line pattern 290. The bit-line 320 crosses the gate 260 and connects with the corresponding contact pad 230 through the bit-line contact 310.

Figure 13C:
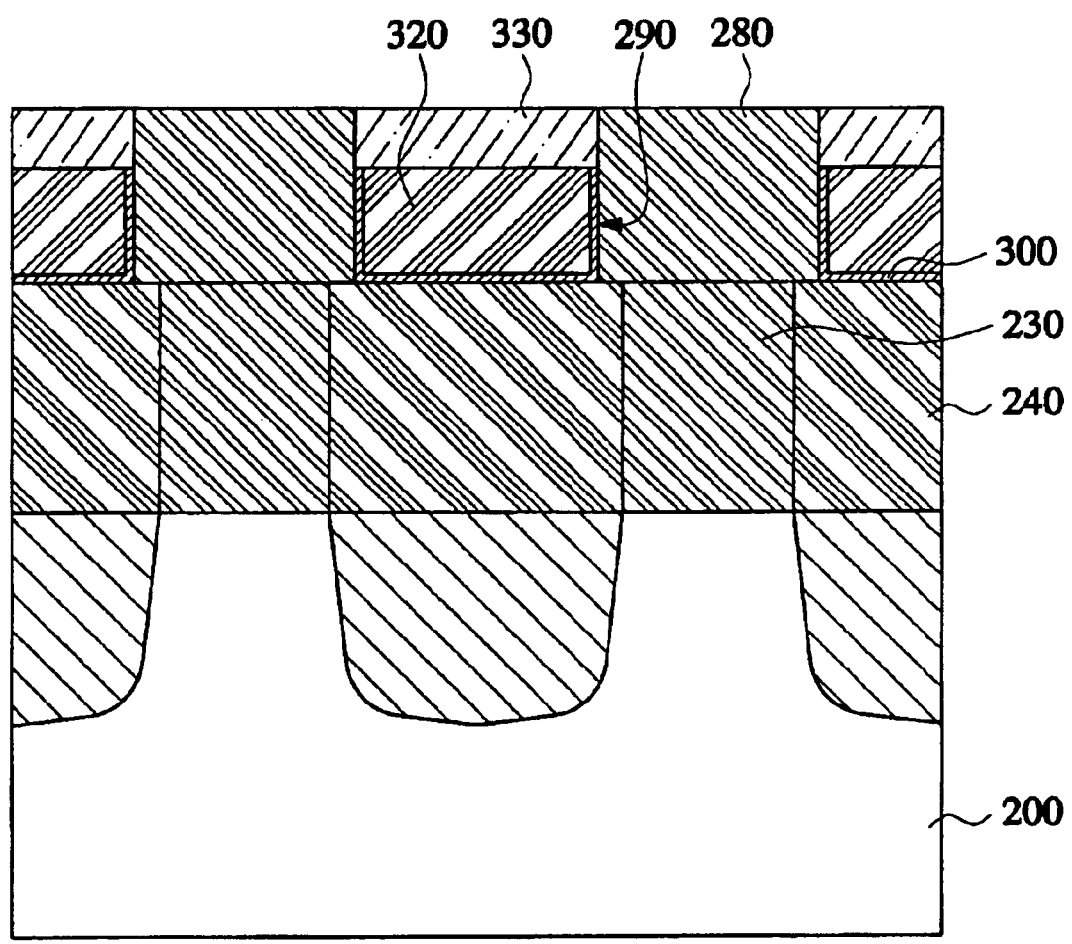

Referring to FIGS. 13A to 13C, the bit line 320 is etched back by a predetermined thickness. An insulation layer such as a nitride layer is deposited on the silicon substrate and etched through a CMP process to form a bit-line capping layer 330 on the etched portion of the bit-line 320 with the bit-line pattern 290. The cross sectional length of the bit-line capping layer 330 in the gate line direction is longer than that of the bit-line 320 in the gate line direction as shown in FIG. 13C.

Although not shown in the drawings, a capacitor is then formed to connect with the storage node contact plug 280, thereby fabricating a DRAM device according to this embodiment of the invention.

Figure 14A:
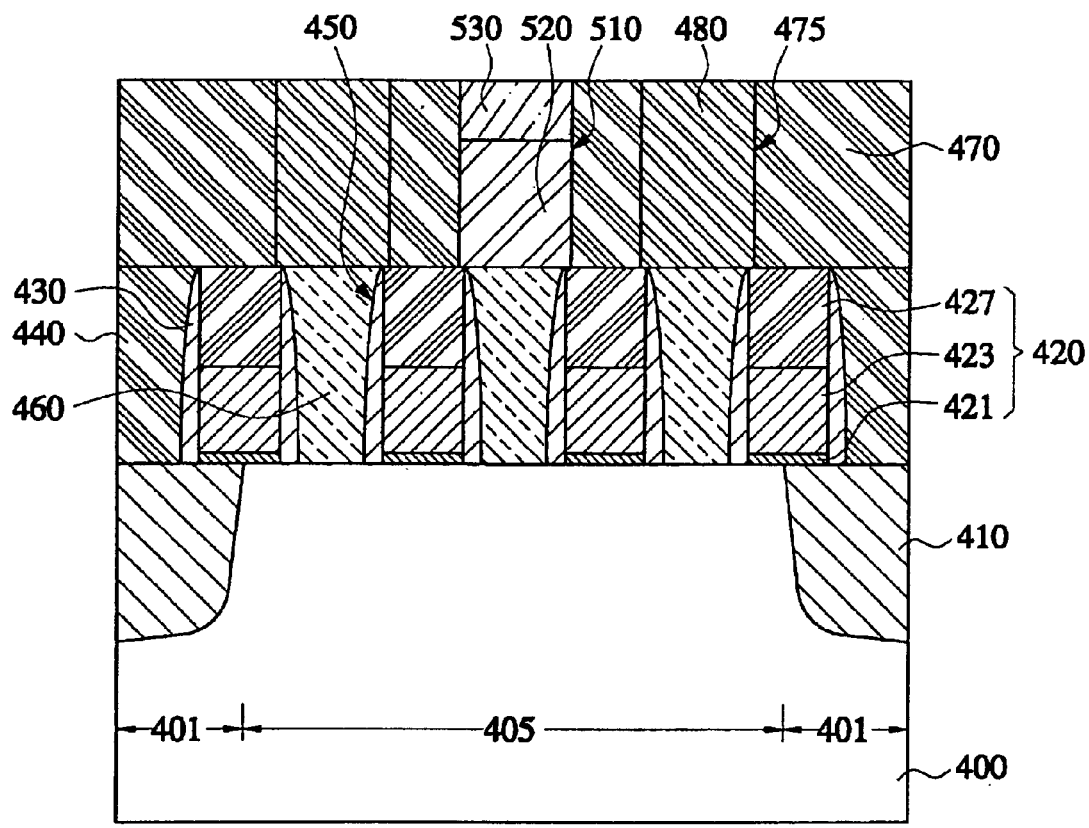
FIGS. 14A and 14C are cross-sectional diagrams illustrating a fabrication method of a semiconductor memory device according to another embodiment of the present invention.
Figure 14B:
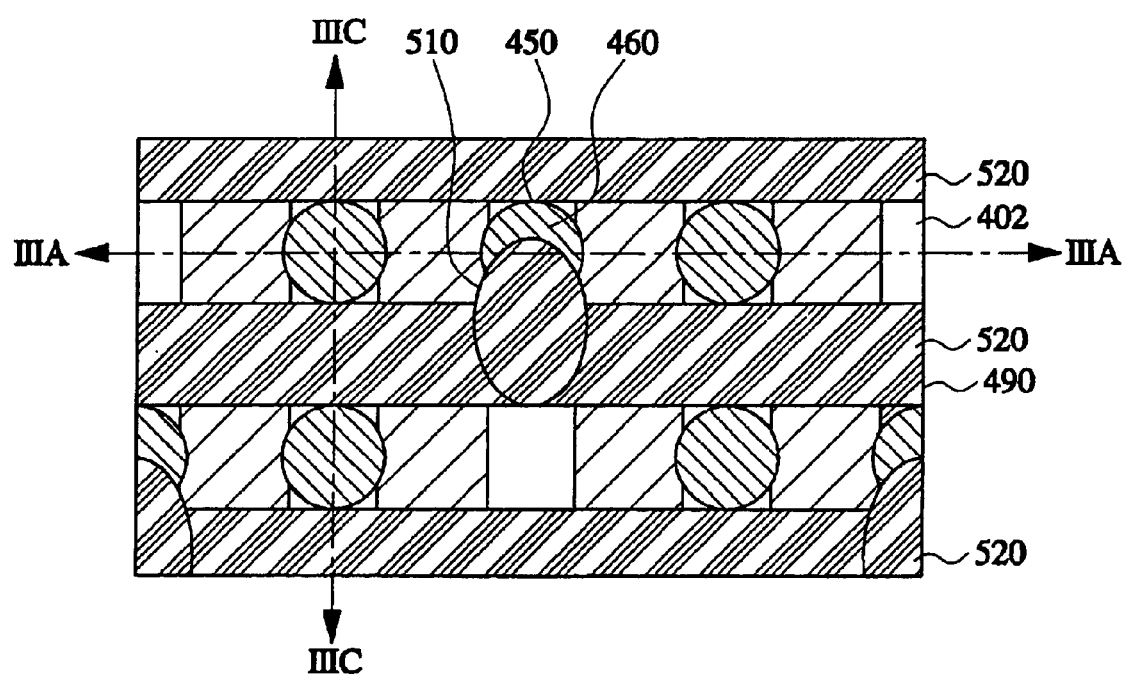
FIG. 14B is a plan diagram illustrating a fabrication method of a semiconductor memory device according to another embodiment of the present invention.
Figure 14C:
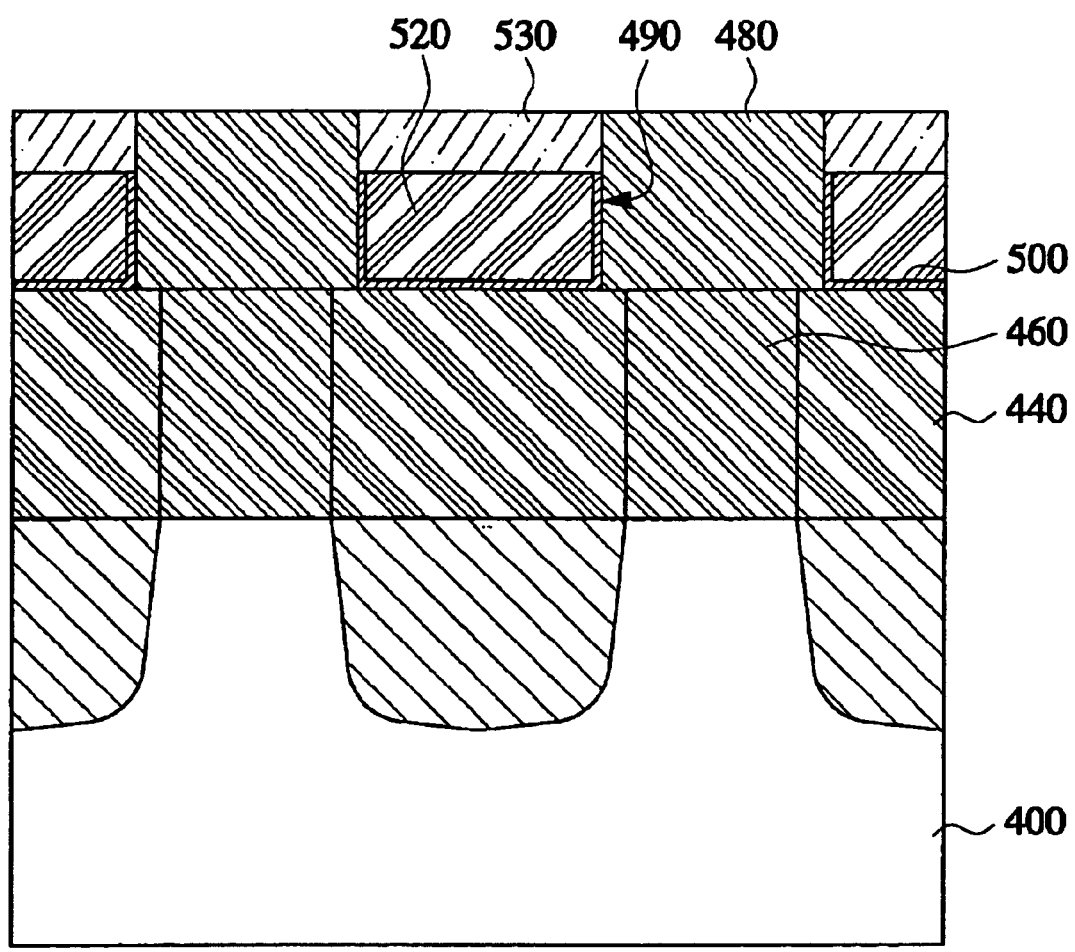

FIGS. 14A to 14C illustrate a fabrication method of a semiconductor memory device according to another embodiment of the invention, wherein FIG. 14A is a cross sectional view taken along the line IIIA—IIIA of FIG. 14B and FIG. 14C is a cross sectional view taken along the line IIIC—IIIC of FIG. 14B.

In this embodiment of the invention, the fabrication process up until the contact pad formation process is the same as the SAC contact pad formation process of the conventional DRAM fabrication process, and the bit-line formation process and the storage node contact pad formation process are the same as the process of the earlier-described embodiment of the invention.

With reference to FIGS. 14A, 14B, and 14C, on a silicon substrate 400 including a STI field isolation 401 and an active region 405, gates 420 having a stack structure that includes a gate insulation layer 421, a gate electrode material 423, and a gate gapping layer 427 are formed. A gate spacer 430 of a nitride layer is in the sidewall of the gate 420 is formed.

A first inter-insulation layer 440 is deposited on the substrate 400 and a CMP process is performed to planarize the silicon substrate 400. The first inter-insulation layer 440 is etched through a SAC process to form SAC contacts 450 and SAC contact pads 460 are formed in the SAC contacts 450. A second inter-insulation layer 470 is deposited on the substrate 400 and etched to form a storage node contact 475 exposing the corresponding contact pad of the SAC contact pads 460 which is connected with a storage node in ta subsequent process. A storage node contact plug 480 is formed in the storage node contact 475.

A portion of the second inter-insulation layer 470 where a bit line is to be formed is etched to form a groove-shaped bit-line pattern 490. An insulation layer 500 for a bit-line spacer is formed on the substrate. The insulation layer 500 is an oxide layer or a high dielectric layer is formed by a thermal oxidation process or by a deposition process. The second inter-insulation layer 470 is etched to form a bit-line contact 510 to expose the corresponding contact pad of the SAC contact pads 460 that is to be connected with a bit-line. A damascene bit-line 520 is formed within the bit-line pattern 490 through a damascene bit-line process, and is connected with the contact pad 460 for a bit-line through the bit-line contact 510. Sequentially, a portion of the bit-line 520 is etched and a bit-line capping layer 530 is formed at the etched portion of the bit-line 520. Although not shown in the drawings, a subsequent storage node fabrication process is performed to fabricate a capacitor, thereby forming a semiconductor memory device according to another embodiment of the present invention.

As described above, according to embodiments of the invention, it is possible to prevent a void and a bridge fail due to a gap-fill fail in an inter-insulation layer by the size reduction of the DRAM device. Furthermore, a leakage current between the storage node contact and the bit-line, and between the gate and the contact pad, can be prevented. A sufficient overlay margin in the storage node contact and the bit-line contact can be ensured, an open fail is prevented, and a contact resistance is reduced.

Embodiments of the invention will now be described in a non-limiting way. Embodiments of the present invention provide a semiconductor memory device and a fabrication method thereof forming a storage node contact before a bit-line contact formation to increase the size of a storage node contact, thereby reducing a contact resistance and increasing an overlay margin.

Embodiments of the invention provide a semiconductor memory device and a fabrication method thereof forming a damascene bit-line to prevent a bridge fail by a void in an inter-insulation layer.

Embodiments of the invention provide a semiconductor memory device and a fabrication method thereof having a bit-line spacer with a high dielectric material to prevent a leakage current between a bit-line and a storage node contact.

Embodiments of the invention provide a semiconductor memory device and a fabrication method thereof using a damascene gate process and a silicon epitaxial process to prevent a bridge between pads due to a void in an inter-insulation layer.

Embodiments of the invention provide a semiconductor memory device and a fabrication method thereof forming a gate spacer with a high dielectric material to prevent a leakage current between a gate and an SAC contact pad.

Embodiments of the invention provide a semiconductor memory device and a fabrication method thereof preventing an increase of a contact resistance due to reduction of an open area and surface treatment, and preventing a contact open fail.

Embodiments of the invention provide a semiconductor memory device and a fabrication method thereof for ensuring a sufficient overlay margin of a bit-line contact.

Some embodiments of the invention provide a semiconductor memory device that includes a silicon substrate including a gate and contact pads at the both sides of the gate; a second inter-insulation layer formed on the substrate, including a storage node contact and a bit-line contact, the second inter-layer insulation layer exposing a corresponding contact pad, and including a groove-shaped bit-line pattern; a storage node contact plug formed in the storage node contact; and a damascene bit line, formed with the bit-line pattern, connected with the exposed corresponding contact pad through the bit-line contact.

Preferably, both the contact pad and the storage node contact plug are either an epitaxial silicon layer or a polysilicon layer. The gate is extended in a first direction, and the bit-line is extended in a second direction crossing the gate; and the cross sectional lengths of the bottom of the storage node contact plug in the first direction and the second direction are longer than the cross sectional lengths of the contact pad in the first direction and in the second direction.

The bit-line includes an insulation layer formed within the bit-line pattern, a bit-line material filling within the bit-line pattern including the insulation layer; and a capping layer formed on the top of the bit-line material within the bit-line pattern. The insulation layer functions as a bit-line spacer for insulating the bit-line and the storage node contact plug. The material of the insulation layer is different from the material of the capping layer, and the cross sectional length of the capping layer in the first direction is longer than the cross sectional length of the bit-line in the first direction. The insulation layer is a thermal oxide layer or high dielectric layer and the capping layer is a nitride layer.

The substrate includes a gate, the gate having a stack structure that includes a gate insulation layer, a gate material, and a capping layer, and a spacer in the sidewall thereof. The substrate also includes a first inter-insulation layer including self-aligned contacts exposing the silicon substrate at both sides of the gate and contact pads formed in the self-aligned contacts, respectively.

The substrate includes: the contact pads formed on the silicon substrate; the damascene type gate having a capping layer thereon, formed between the contact pads; an insulation layer formed on the bottom and the sidewall of the damascene gate; and a first inter-insulation layer formed on the silicon substrate to expose the contact pads and the capping layer. The thickness difference between portions of the insulation layer at the bottom and at the sidewall of the gate is within 7 nm; the portion of the insulation layer formed at the bottom of the gate functions as a gate insulation layer; and the portion of the insulation layer formed at the sidewall of the gate functions as a gate spacer.

Another embodiment of the invention provides a fabrication method of a semiconductor memory device including the processes of providing a silicon substrate including a gate and contact pads, forming a second inter-insulation layer on the silicon substrate, etching the second inter-insulation layer to form a storage node contact exposing a corresponding contact pad of the contact pads, forming a contact plug in the storage node contact, etching the second inter-insulation layer to form a groove-shaped bit-line pattern, etching the second inter-insulation layer to form a bit-line contact exposing a corresponding contact pad of the contact pads, and forming a damascene bit-line within the bit-line pattern that is connected with the corresponding contact pad through the bit-line contact.

The capping layer formation method includes the processes of etching back a portion of the insulation layer and the bit-line material within the bit-line pattern, depositing a nitride layer on the silicon substrate, and etching the nitride layer through a chemical mechanical polishing (CMP) process to form the capping layer.

The process of providing the substrate including the gate and the contact pads includes forming a gate having a stack structure that includes a gate insulation layer, a gate insulation material and a capping layer on a silicon substrate and a spacer at the sidewall of the gate. The process also includes forming a first inter-insulation layer on the silicon substrate, etching the first insulation layer to form SAC contacts exposing the silicon substrate at the both sides of the gate, and forming contact pads in the SAC contacts.

The process of providing the substrate including the gate and the contact pads includes forming a sacrifice gate including a sacrifice gate insulation layer on a silicon substrate, forming contact pads on the silicon substrate at both sides of the gate, forming a first inter-insulation layer on substrate to expose the contact pads and the sacrifice gate, removing the exposed sacrifice gate to form an opening exposing the silicon substrate, and forming a gate including an insulation layer in a bottom and a sidewall of the opening and a capping layer on the top thereof.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A fabrication method of a semiconductor memory device comprising the steps of:

providing a silicon substrate including a gate that extends in a first direction and contact pads;

forming a second inter-insulation layer on the silicon substrate;

etching the second inter-insulation layer to form a storage node contact exposing a first one of the contact pads, a cross-sectional length of the bottom of the storage node contact in the first direction and in a second direction is longer than a cross-sectional length of the first contact pad in the first direction and in the second direction, respectively;

forming a contact plug in the storage node contact that is connected to the first one of the contact pads;

etching the second inter-insulation layer to form a bit-line pattern with a groove shape;

etching the second inter-insulation layer to form a bit-line contact exposing a second one of the contact pads; and forming a damascene bit-line within the bit-line pattern that crosses the gate in the second direction, the bit line connected with the second one of the contact pads through the bit-line contact.

2. The fabrication method of a semiconductor memory device according to claim 1, wherein the contact pad and the storage node contact plug comprise an epitaxially grown silicon layer.

3. The fabrication method of a semiconductor device according to claim 1, wherein the contact pad and the storage node contact plug comprise a polysilicon layer.

4. The fabrication method of a semiconductor memory device according to claim 1, wherein providing the silicon substrate including the gate and the contact pads comprises:

forming a gate having a stack structure of a gate insulation layer, a gate insulation material, and a capping layer on the silicon substrate;

forming a spacer at the sidewall of the gate;

forming a first inter-insulation layer on the silicon substrate;

etching the first insulation layer to form self-aligned contacts exposing the silicon substrate at both sides of the gate; and forming the contact pads in the self-aligned contacts.

5. The fabrication method of a semiconductor memory device according to claim 1, wherein providing the silicon substrate including the gate and the contact pads comprises:

forming a sacrifice gate comprising a sacrifice gate insulation layer on the silicon substrate;

forming the contact pads on the silicon substrate at both sides of the sacrifice gate;

forming a first inter-insulation layer on the silicon substrate to expose the contact pads and the sacrifice gate;

removing the exposed sacrifice gate to form an opening exposing the silicon substrate; and forming the gate including an insulation layer in a bottom and a sidewall of the opening and a capping layer on the top thereof.

6. The fabrication method of a semiconductor memory device according to claim 5, wherein the insulation layer is chosen from the group consisting of a thermal oxide layer and a high dielectric layer; wherein a thickness difference between a portion of the insulation layer at a bottom of the gate and a portion of the insulation layer at a sidewall of the gate is within 7 nm; wherein the portion of the insulation layer at the bottom of the gate comprises a gate insulation layer; and a portion of the insulation layer at the sidewall of the gate comprises a gate spacer that isolates the gate from one of the contact pads.

7. The fabrication method of a semiconductor memory device according to claim 1, wherein forming the damascene bit-line further comprises:

forming an insulation layer formed within the bit-line pattern;

forming a bit-line material filling within the bit-line pattern including the insulation layer; and forming a capping layer on a top of the bit-line.

8. The fabrication method of a semiconductor memory device according to claim 7, wherein forming the insulation layer comprises:

forming a bit-line spacer for insulating the bit-line and the storage node contact plug, the bit-line spacer chosen from the group consisting of an oxide layer and a high dielectric layer.

9. The fabrication method of claim 8, wherein forming the bit-line spacer comprises forming the bit line spacer using a process chosen from the group consisting of a thermal oxidation process and a deposition process.

10. The fabrication method of a semiconductor memory device according to claim 7, further comprising:

forming the capping layer from a material that is different from a material used for the insulation layer, and wherein a cross sectional length of the capping layer in the first direction is longer than a cross sectional length of the bit-line in the first direction.

11. The fabrication method of a semiconductor memory device according to claim 10, wherein forming the capping layer comprises:

etching back a portion of the insulation layer and the bit-line material within the bit-line pattern;

depositing a nitride layer on the silicon substrate; and etching the nitride layer through a chemical mechanical polishing (CMP) process to form the capping layer.

* * * * *